US011713010B2

(12) United States Patent
Ji et al.

(10) Patent No.: US 11,713,010 B2
(45) Date of Patent: Aug. 1, 2023

(54) RECREATIONAL VEHICLE CONTROL APPARATUS AND RECREATIONAL VEHICLE

(71) Applicant: Estone Technology LTD., Shenzhen (CN)

(72) Inventors: Zhaoliang Ji, Shenzhen (CN); Shiguo Liu, Shenzhen (CN)

(73) Assignee: Estone Technology LTD., Shenzhen (CN)

(*) Notice: Subject to any disclaimer, the term of this patent is extended or adjusted under 35 U.S.C. 154(b) by 515 days.

(21) Appl. No.: 17/035,621

(22) Filed: Sep. 28, 2020

(65) Prior Publication Data
US 2021/0362665 A1    Nov. 25, 2021

(30) Foreign Application Priority Data
May 25, 2020 (CN) .......................... 202010447528.9

(51) Int. Cl.
| H03K 17/00 | (2006.01) |
| B60R 16/03 | (2006.01) |
| B60Q 3/80 | (2017.01) |
| B60Q 3/40 | (2017.01) |
| B60H 1/00 | (2006.01) |
| B60P 3/32 | (2006.01) |
| B60R 15/00 | (2006.01) |

(52) U.S. Cl.
CPC ......... *B60R 16/03* (2013.01); *B60H 1/00364* (2013.01); *B60P 3/32* (2013.01); *B60Q 3/40* (2017.02); *B60Q 3/80* (2017.02); *B60R 15/00* (2013.01)

(58) Field of Classification Search
None
See application file for complete search history.

(56) References Cited

U.S. PATENT DOCUMENTS 10,818,458 B2 * 10/2020 Leonard .................... H02P 7/04

FOREIGN PATENT DOCUMENTS

| CN | 201725736 | 1/2011 |
| CN | 102541104 | 7/2012 |
| CN | 206922676 | 1/2018 |
| CN | 107947652 | 4/2018 |
| CN | 108340898 | 7/2018 |
| DE | 3941651 | 6/1991 |

* cited by examiner

*Primary Examiner* — Jeffery S Zweizig
(74) *Attorney, Agent, or Firm* — JCIPRNET

(57) ABSTRACT

A recreational vehicle control apparatus and a recreational vehicle are provided. The recreational vehicle control apparatus includes a first controlled switch configured to generate a first output signal in response to receiving a first control signal, and switch a polarity of the first output signal based on a status of the first control signal. A second controlled switch is configured to generate a second output signal in response to receiving the first control signal. The second controlled switch outputs the second output signal to a first controlled end of a controlled object group. A third controlled switch is configured to generate a third output signal in response to receiving the second control signal and the first output signal transmitted by the first controlled switch. The third controlled switch outputs the third output signal to a second controlled end of the controlled object group. The present application may save wires and equipment with high integration level and small space occupation.

20 Claims, 6 Drawing Sheets

RECREATIONAL VEHICLE CONTROL APPARATUS AND RECREATIONAL VEHICLE

CROSS-REFERENCE TO RELATED APPLICATION

This application claims the priority benefit of China application serial no. 202010447528.9, filed on May 25, 2020. The entirety of the above-mentioned patent application is hereby incorporated by reference herein and made a part of this specification.

TECHNICAL FIELD

The present application relates to the field of recreational vehicle control technology, specifically to a recreational vehicle control apparatus and a recreational vehicle.

BACKGROUND

A recreational vehicle is a movable vehicle equipped with household essentials. In order to meet household performance and space demands, several types of functional units or structures, such as a heating component, a lighting component, a temperature regulation component, a water supply component, a rain-shedding component, a space extension component and the like are mounted on the recreational vehicle. Only by controlling working statuses and performances of the functional components properly may each function of the recreational vehicle be realized.

However, there exist several problems for the current recreational vehicle control approach: each individual controlled unit or structure is controlled independently, hence connection wires for control is numerous with complex routing, large space occupation, poor integration level and high equipment cost.

There is still no proper solution to provide a recreational vehicle control approach to save wires and equipment with high integration level and small space occupation.

SUMMARY

Based on the problems mentioned above, a recreational vehicle control apparatus which may save wires and equipment with high integration level and small space occupation, as well as a recreational vehicle having the recreational vehicle control apparatus is provided.

One embodiment of the present application provides a recreational vehicle control apparatus which comprises:

a first controlled switch configured to generate a first output signal in response to receiving a first control signal, and switch a polarity of the first output signal based on a status of the first control signal;

a second controlled switch configured to generate a second output signal in response to receiving the first control signal, and switch a polarity of the second output signal based on the status of the first control signal; the second controlled switch outputs the second output signal to a first controlled end of a controlled object group; the controlled object group comprises a plurality of controlled objects, and the first controlled end is connected with a first input end of each of the controlled objects; and a third controlled switch configured to generate a third output signal in response to receiving the second control signal and the first output signal transmitted by the first controlled switch; a polarity of the third output signal is opposite to the polarity of the second output signal; the third controlled switch outputs the third output signal to a second controlled end of the controlled object group; the second controlled end is connected to a second input end of each of the controlled objects.

Another embodiment of the present application provides a recreational vehicle comprising a recreational vehicle body and the recreational vehicle control apparatus above.

Based on the technical solutions above, the recreational vehicle control apparatus and the recreational vehicle provided by the present application may connect and control a plurality of controlled objects using only one set of control components and generate output signals for different controlled objects based on the first control signal and the second control signal using the first controlled switch, the second controlled switch and the third controlled switch in accompany with the first control signal and the second control signal. The present application saves wires and equipment with high integration level and small space occupation, and hence saves cost for the recreational vehicle effectively.

BRIEF DESCRIPTION OF THE ACCOMPANYING DRAWINGS

In order to clearly illustrate the embodiments of this invention or the technical solutions in the existing technology, the following is a brief introduction of the drawings required for the description of the embodiments and of the existing technology. Obviously, the drawings in the following description are only some embodiments of this invention. For the ordinary technicians in this field, other drawings may be obtained based on the drawings without paying creative work.

DETAILED DESCRIPTION OF ILLUSTRATED EMBODIMENTS

In order to make the purpose, technical solutions and the technical effects of the present application clearer, the present disclosure will be further illustrated in details in combination with the drawings and the specific embodiments. It should be understood that the specific embodiments described in this specification are intended only to explain the application but not for limit purpose. Embodiments and features thereof in the present application may be combined without occurring contradiction.

Figure 1:
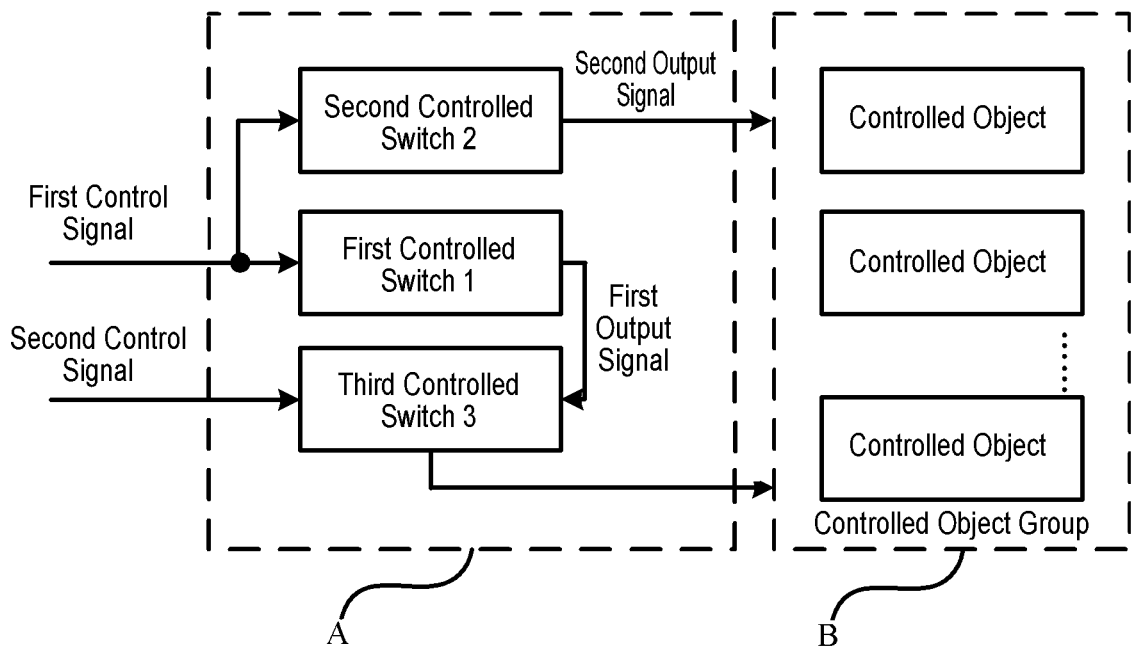
FIG. 1 is a structural block view of a recreational vehicle control apparatus according to an embodiment.

As shown in FIG. 1, a recreational vehicle control apparatus A is provided by the present application. In one embodiment, the recreational vehicle control apparatus A includes a first controlled switch 1, a second controlled switch 2 and a third controlled switch 3. The first controlled switch 1, the second controlled switch 2 and the third controlled switch 3 may be relays, contractors, switch tubes, electronic switches and any other component capable of performing the controlled switch functions of the present application. For example, the first controlled switch 1, the second controlled switch 2, the third controlled switch 3 and the fourth controlled switch 4 may all be normally closed relays. The first controlled switch 1, the second controlled switch 2 and the third controlled switch 3 may adopt identical or different components. Other than being a movable vehicle arranged with household essentials, the recreational vehicle may also be other special vehicles for equivalent purposes.

The first controlled switch 1 in the embodiment is configured to generate a first output signal in response to receiving a first control signal, and switch a polarity of the first output signal based on a status of the first control signal; the second controlled switch 2 is configured to generate a second output signal in response to receiving the first control signal, and switch a polarity of the second output signal based on the status of the first control signal; the polarity of the first output signal and the polarity of the second output signal vary along with different signal statuses of the first control signal. Therefore, the first output signal and the second output signal may be regulated by controlling the signal statuses of the first control signal, therefore changing the control of the controlled objects. The third controlled switch 3 is configured to generate a third output signal in response to receiving the second control signal and the first output signal transmitted by the first controlled switch 1. By controlling the signal statuses of the second control signal, it may be determined whether to output the third output signal by the third controlled switch 3; the polarity of the third output signal is opposite to the polarity of the second output signal.

The second controlled switch 2 in the present embodiment outputs the second output signal to the first controlled end 11 of the controlled object group B. the controlled object group B may be a functional unit or structure arranged on the recreational vehicle for control purpose and includes a plurality of (two or more) controlled objects. The controlled object group B may include electrical machineries respectively arranged on the recreational vehicle. The electrical machineries are configured to drive a telescopic component on the recreational vehicle, for example, an electrical machinery or motor for driving the telescopic component on the recreational vehicle. The telescopic component may be an expansion tank which may expand out of or withdraw back in the recreational vehicle. The telescopic component may be a telescopic shade canopy, or other telescopic structures arranged on the recreational vehicle. As controlled objects, the electrical machinery and the motor may drive other assemblies arranged on the recreational vehicle. The electrical machinery and the motor may be controlled to rotate forward or reversely by switching the first control signal, thereby stretching out or drawing back the telescopic component. the first controlled end 11 connects with a first input end of each controlled object. For example, the first input end of the controlled object may be a positive or a negative pole of the electrical machinery. The third controlled switch 3 output the third output signal to the second controlled end 12 of the controlled object group B. The second controlled end 12 connects with a second input end of each controlled object. The second input end of the controlled object may be a negative or a positive pole of the electrical machinery. The first controlled end 11 and the second controlled end 12 respectively connect with the first input end and the second input end of each of the controlled objects, which means the plurality of controlled objects share the recreational vehicle control apparatus A including the first controlled switch 1, the second controlled switch 2 and the third controlled switch 3. The first control signal and the second control signal may be adjusted based on different controlled objects. Assume the controlled object group B may include two controlled objects, which are the expansion tank and the telescopic shade canopy, when the expansion tank requires to be controlled, the first controlled switch 1, the second controlled switch 2 and the third controlled switch 3 receive the first control signal and the second control signal, and generate the second output signal and the third output signal which are output to the electrical machinery which drives the expansion tank; when the shade canopy requires to be controlled, the first controlled switch 1, the second controlled switch 2 and the third controlled switch 3 receive the first control signal and the second control signal, and generate the second output signal and the third output signal which are output to the electrical machinery which drives the shade canopy. When the controlled object group B includes a plurality of controlled objects, each of the controlled objects directly shares the recreational vehicle control apparatus A which comprises the first controlled switch 1, the second controlled switch 2 and the third controlled switch 3. Each of the controlled objects may be controlled in a time-sharing or simultaneous way.

The apparatus in the present embodiment may connect and control a plurality of controlled objects using only one set of control components, and generate output signals for different controlled objects based on the first control signal and the second control signal via the first controlled switch 1, the second controlled switch 2 and the third controlled switch 3 in accompany with the first control signal and the second control signal. The present application saves wires and equipment with high integration level and small space occupation, and hence saves cost for the recreational vehicle effectively.

In one embodiment, in accordance with a determination that the first control signal is in a first status, the polarity of the second output signal may be a first polarity, the polarity of the third output signal a second polarity; in accordance with a determination that the first control signal is in a second status, the polarity of the second output signal may be the second polarity, the polarity of the third output signal the first polarity. The first control signal has at least two statuses comprising the first status and the second status, different signal status having different electrical levels, such as when the first status is a high electrical level, then the second status is a low electrical level. The first polarity may be positive pole, a negative pole, or zero; the second polarity may be negative pole, positive pole or zero. A unipolar signal may be formed between the second output signal and the third output signal, and one of the second output signal and the third output signal has a positive polarity, and the other one has a zero polarity. A bipolar signal may be formed between the second output signal and the third output signal, and one of the second output signal and the third output signal has a positive polarity, and the other one has a negative polarity.

Figure 2:
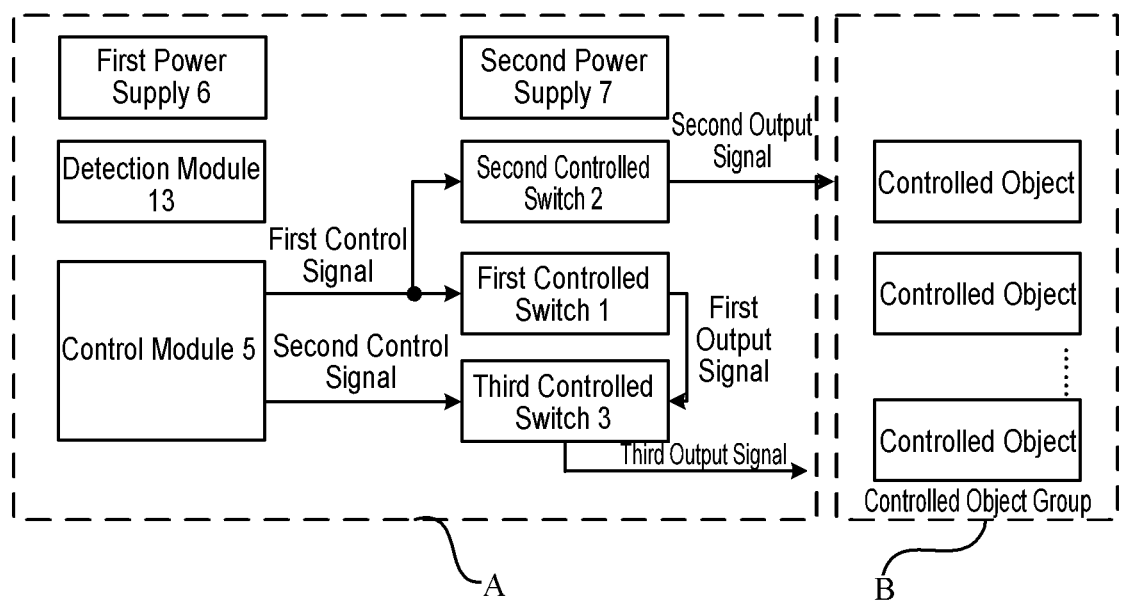
FIG. 2 is a structural block view of the recreational vehicle control apparatus according to another embodiment.

Referring to FIG. 2, in one embodiment, the apparatus further comprises a control module 5 connected with the first controlled switch 1, the second controlled switch 2 and the third controlled switch 3. The control module 5 is configured to output the first control signal and the second control signal.

Figure 3:
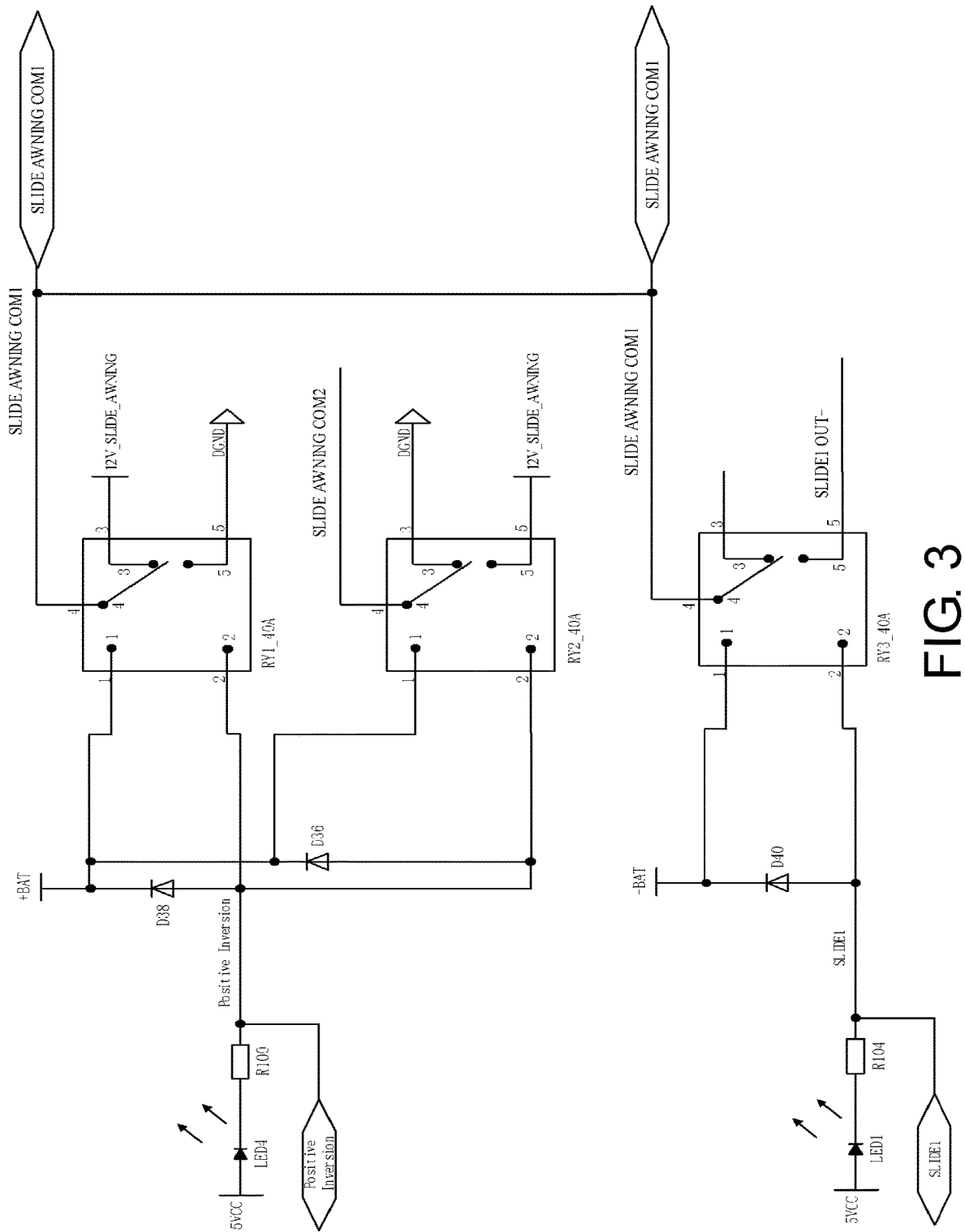
FIG. 3 is a schematic circuit diagram of the recreational vehicle control apparatus according to yet another embodiment.
Figure 4:
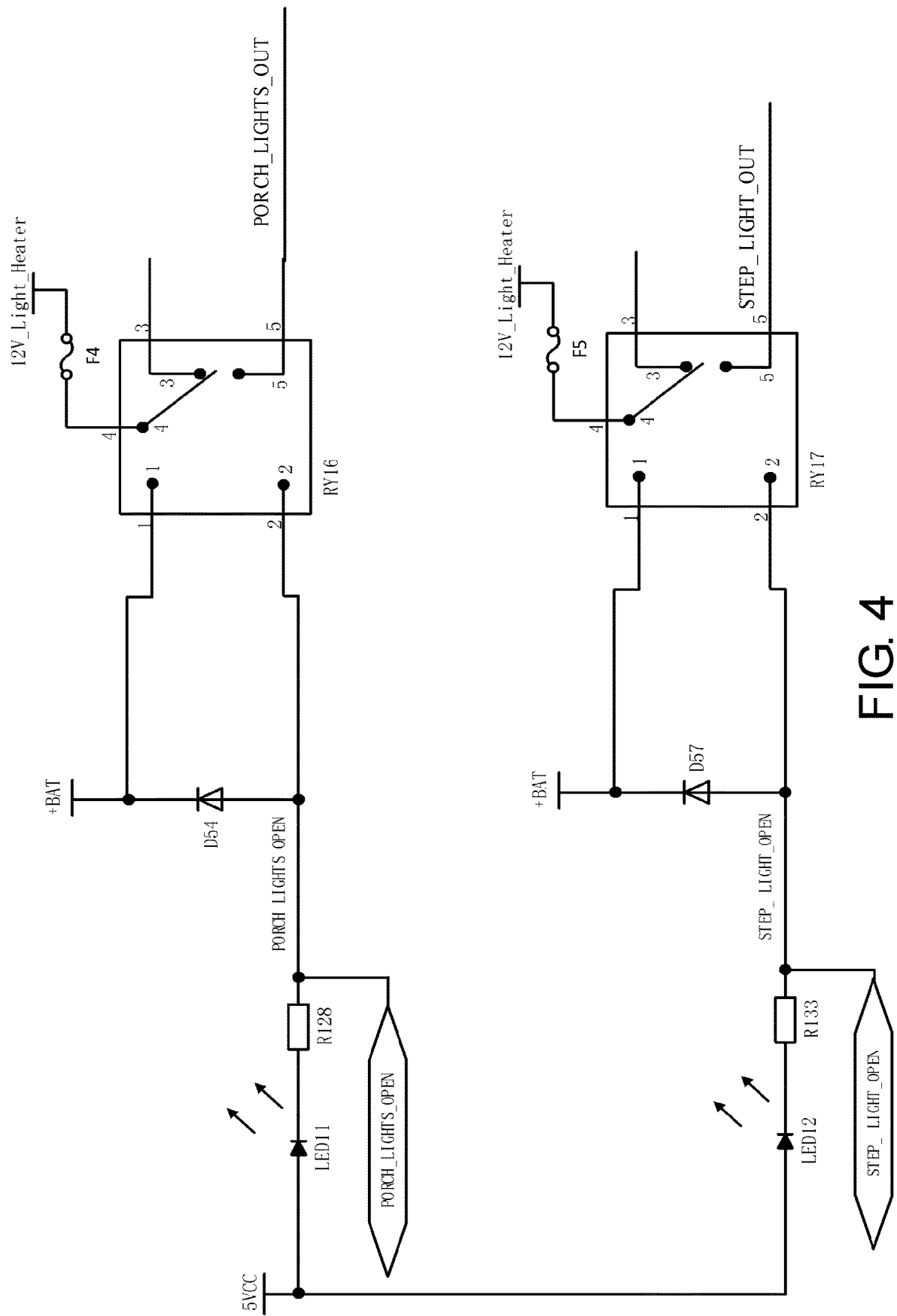
FIG. 4 is a schematic circuit diagram of the recreational vehicle control apparatus according to yet another embodiment.

As shown in FIGS. 3 and 4, in one embodiment, the first controlled switch 1 may comprise a first coil, a first dynamic contact, a first static contact and a second static contact; the second controlled switch 2 may comprise a second coil, a second dynamic contact, a third static contact and a fourth static contact. Referring to FIG. 2, the apparatus further comprises a first power supply 6 and a second power supply 7. The first power supply 6 is for supplying power to the first coil and the second coil; the second power supply 7 is for supplying power to the controlled object group B via the first controlled switch 1 and the second controlled switch 2; a first end of the first coil and a first end of the second coil are both connected to an output positive end of the first power supply 6; a second end of the first coil and a second end of the second coil both receive the first control signal; in accordance with a determination that the first coil is powered off, the first dynamic contact contacts with the first static contact; in accordance with a determination that the first coil is powered on, the first dynamic contact contacts with the second static contact; the first static contact is connected with an output positive end of the second power supply 7, the second static contact connected with an output negative end of the second power supply 7; the first output signal is output by the first dynamic contact; in accordance with a determination that the second coil is powered off, the second dynamic contact contacts with the third static contact; in accordance with a determination that the second coil is powered on, the second dynamic contact contacts with the fourth static contact; the third static contact is connected with the output negative end of the second power supply 7, the fourth static contact connected with an output positive end of the second power supply 7; the second output signal is output by the second dynamic contact. For example, as shown in FIG. 3, the relay RY1_40A refers the first controlled switch 1; the pins 1 and 2 of the relay RY1_40A refer to the first coil; the pin 4 of the RY1_40A refers to the first dynamic contact; the pin 3 of the RY1_40A refers to the first static contact; the pin 5 of the RY1_40A refers to the second static contact; the relay RY2_40A refers the second controlled switch 2; the pins 1 and 2 of the relay RY2_40A refer to the second coil; the pin 4 of the RY2_40A refers to the second dynamic contact; the pin 3 of the RY2_40A refers to the third static contact; the pin 5 of the RY2_40A refers to the fourth static contact; the internet label of "Positive Inversion" refers to the first control signal; the internet label of "SLIDE AWNING COM1" refers to the first output signal; the internet label of "SLIDE AWNING COM2" refers to the second output signal; the "+BAT" refers to the output positive end of the first power supply 6; the "12V_SLIDE_AWNING" refers to the output positive end of the second power supply 7; the "DGND" refers to the output negative end of the second power supply 7.

In one embodiment, as shown in FIG. 3, the third controlled switch 3 may comprise a third coil, a third dynamic contact, a fifth static contact and a sixth static contact, a first end of the third coil connected with an output positive end of the first power supply 6, a second end of the third coil receiving the second control signal; in accordance with a determination that the third coil is powered off, the third dynamic contact contacts with the fifth static contact; in accordance with a determination that the third coil is powered on, the third dynamic contact contacts with the sixth static contact; the third dynamic contact receives the first output signal, the sixth static contact outputting the third output signal. For example, as shown in FIG. 3, the relay RY3_40A refers the third controlled switch 3; the pins 1 and 2 of the relay RY3_40A refer to the first coil; the pin 4 of the RY3_40A refers to the third dynamic contact; the pin 3 of the RY3_40A refers to the fifth static contact; the pin 5 of the RY3_40A refers to the sixth static contact; the internet label of "SLIDE1" refers to the second control signal; the internet label of "SLIDE AWNING COM1" refers to the first output signal; the internet label of "SLIDE OUT+" refers to the third output signal.

For example, when the signal status of the first control signal, Positive Inversion, is high level, the pin 3 and pin 4 of the relay RY1_40A and the pin 3 and pin 4 of the relay RY2_40A are all in a conducting status; the output of the first output signal SLIDE AWNING COM1 is a positive pole, and connected to the pin 4 of the relay RY3_40A; the second output signal SLIDE AWNING COM2 is a negative pole, and connected to the first input end of the controlled object, such as the negative pole of the electrical machinery. At the same time, the signal status of the second control signal SLIDE 1 is low level, the pin 4 and pin 5 of the RY3_40A are in the conducting status, the pin 5 of the relay RY3_40A is connected to the second input end of the controlled object, such as the positive pole of the electrical machinery, thereby rotating the electrical machinery forward.

When the signal status of the first control signal, Positive Inversion, is low level, the pin 4 and pin 5 of the relay RY1_40A and the pin 4 and pin 5 of the relay RY2_40A are all in a conducting status; the output of the first output signal SLIDE AWNING COM1 is a negative pole, and connected to the pin 4 of the relay RY3_40A; the second output signal SLIDE AWNING COM2 is a positive pole, and connected to the first input end of the controlled object, such as the negative pole of the electrical machinery. At the same time, the signal status of the second control signal SLIDE 1 is low level, the pin 4 and pin 5 of the RY3_40A are in the conducting state, the pin 5 of the relay RY3_40A is connected to the second input end of the controlled object, such as the positive pole of the electrical machinery, thereby rotating the electrical machinery reversely.

Figure 7:
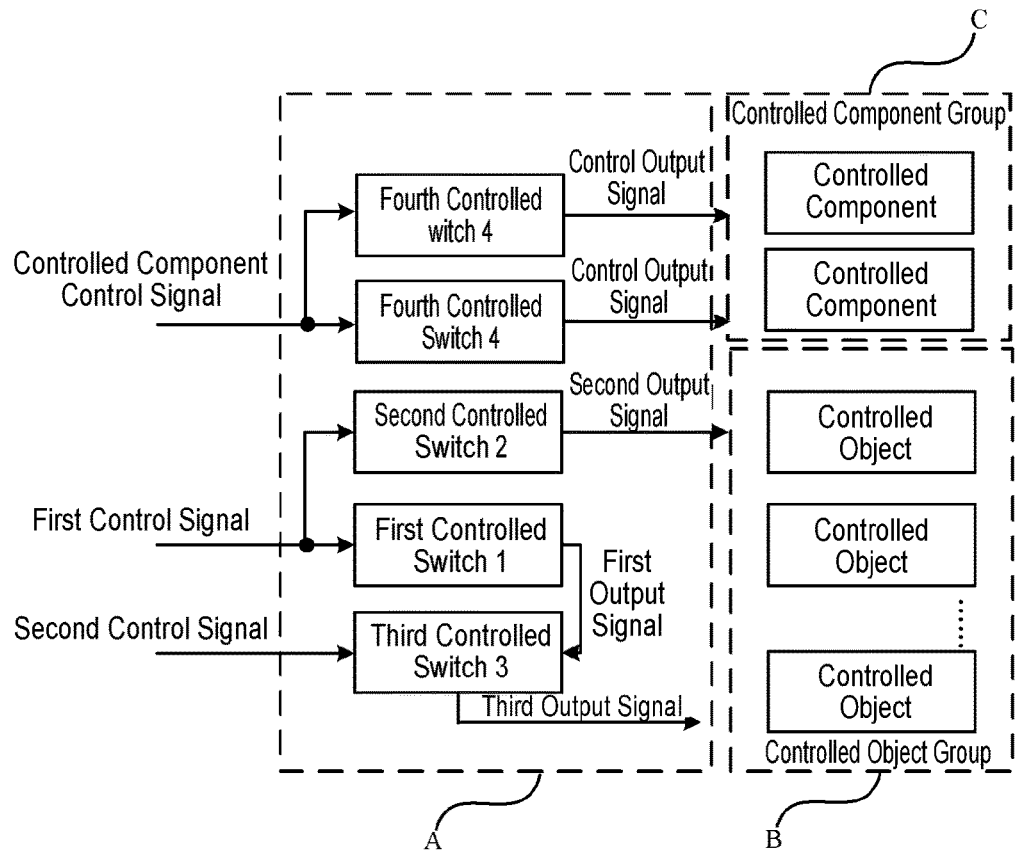
FIG. 7 is a structural block view of the recreational vehicle control apparatus according to yet another embodiment.

In one embodiment, as shown in FIGS. 4 and 7, the apparatus further comprises a plurality of fourth controlled switches 4 configured to control a controlled component group C. Each fourth controlled switch 4 is connected with one controlled component of the controlled component group C and generates a control output signal output to the controlled component in response to receiving a controlled component control signal. Each of the fourth controlled switches controls one type of controlled components. The controlled component control signal may adjust according to different controlled components. The controlled component group C may comprise at least one of a heating component, a lighting component, a temperature regulation component and a water supply component arranged on the recreational vehicle. The heating component may be a heater arranged on the recreational vehicle. The lighting component may be a lamp arranged on the recreational vehicle. The temperature regulation component may be an air conditioner arranged on the recreational vehicle. The water supply component may be a water pump arranged on the recreational vehicle. The number of the fourth controlled switches 4 should match with the types of the controlled components. Each type of controlled components may be plural. For example, the lighting component may comprise a plurality of lamps arranged on the recreational vehicle which are connected with an individual fourth controlled switch 4 and controlled by the fourth controlled switch 4 in a simultaneously or time-sharing way. For example, in FIG. 4, the relays RY16, RY17 both refer to the fourth controlled switch 4; the internet labels of PORCH_LIGHTS_OPEN, STEP_LIGHT_OPEN both refer to the controlled component control signals; the internet labels of PORCH_LIGHTS_OUT, STEP_LIGHT_OUT both refer to the control output signals. For example, when the signal status of the controlled component control signal, PORCH_LIGHTS_OPEN, is high level, the pin 4 and pin 3 of the relay RY16 is in a conducting status; when the signal status of the controlled component control signal, PORCH_LIGHTS_OPEN, is low level, the pin 4 and pin 5 of the relay RY16 is in a conducting status, the control output signal PORCH_LIGHTS_OUT will output the power supply voltage connected by the pin 4 of the relay RY16.

Figure 5:
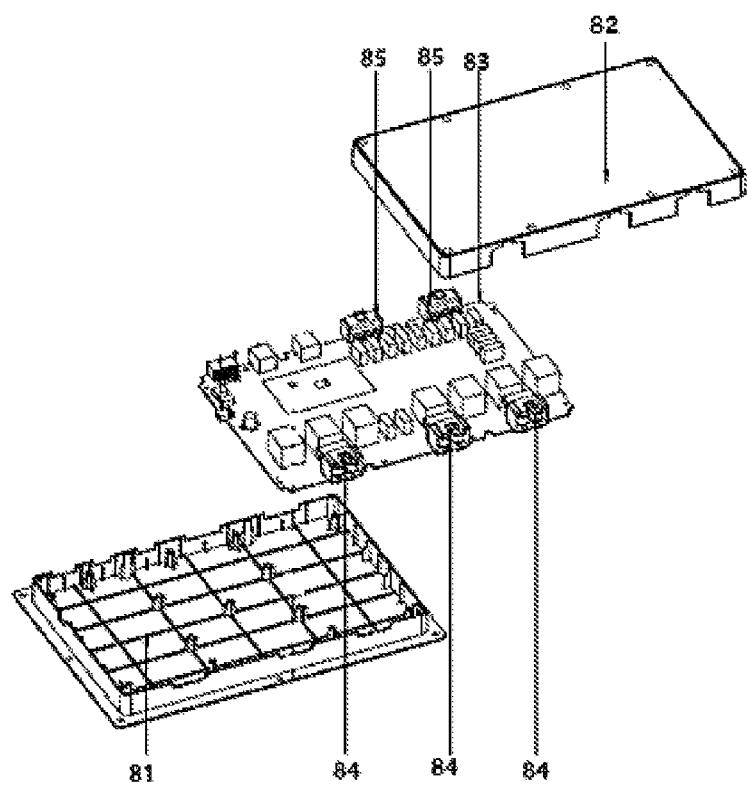
FIG. 5 is a structural diagram of a switch box according to yet another embodiment.

Referring to FIGS. 2 and 5, in one embodiment, the apparatus further comprises a power supply main interface 10 for inputting the second power supply 7 and connecting with the first controlled switch 1, the second controlled switch 2, the third controlled switch 3 and the fourth controlled switch 4. The first controlled switch 1, the second controlled switch 2 and the third controlled switch 3 are assembled in a circuit board; upon input by the power supply main interface 10, the second power supply 7 is distributed on the circuit board to the first controlled switch 1, the second controlled switch 2 and the third controlled switch 3.

Figure 6:
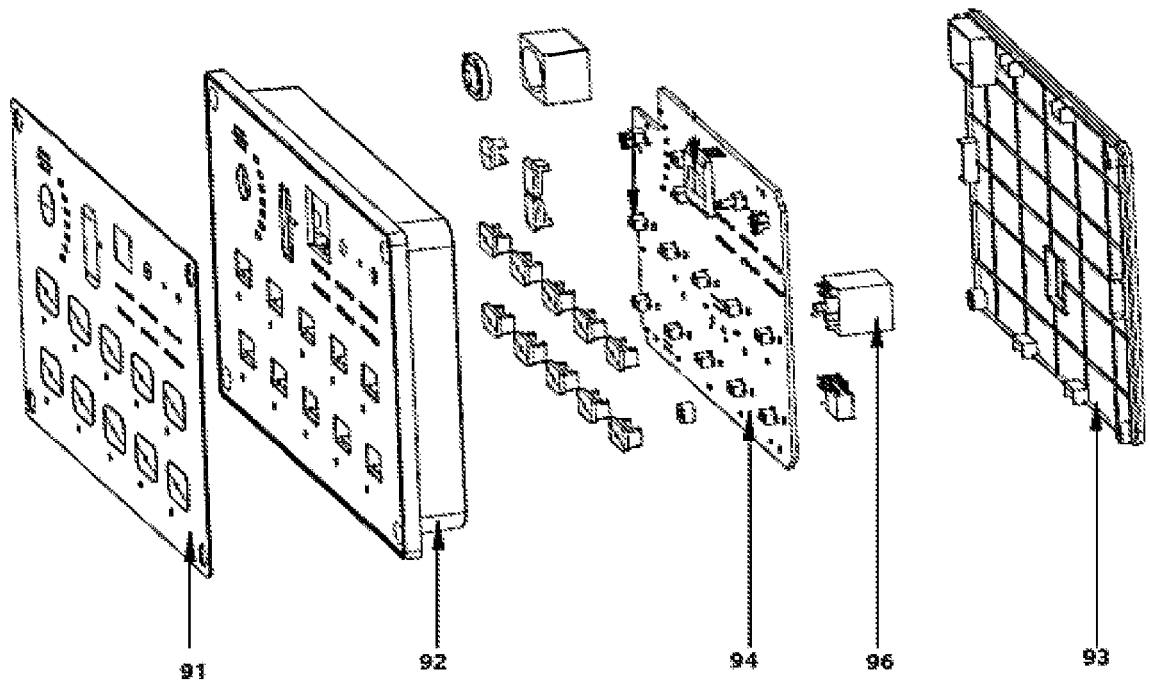
FIG. 6 is a structural block view of a control panel according to yet another embodiment.

Referring to FIGS. 5 and 6, in one embodiment, the apparatus further comprises a switch box 8 and a control panel 9. The switch box 8 is configured for accommodating the first controlled switch 1, the second controlled switch 2, the third controlled switch 3 and the fourth controlled switch 4; the control panel 9 is connected with the switch box 8 and configured for outputting the first control signal, the second control signal and the controlled component control signal to the switch box 8. By utilizing the switch box 8 and the control panel 9 as accommodating components for the constituent parts of the recreational vehicle control apparatus A, the integration of the apparatus is effectively improved with decreased occupied space, which saves the wires.

As shown in FIG. 5, in one embodiment, the switch box 8 may comprise a first housing 81, a second housing 82, a first circuit board 83, a first interface 84 and a second interface 85. The second housing 82 may engage with the first housing 81; the first controlled switch 1, the second controlled switch 2, the third controlled switch 3 and the fourth controlled switch 4 are assembled in the first circuit board 83; the first circuit board 83 is arranged between the first housing 81 and the second housing 82; the first interface 84 is configured to input the first control signal, the second control signal and the controlled component control signal; the first interface 84 is connected with the control panel 9; the second interface 85 is configured to output the second output signal and the third output signal; the second interface 85 is connected with the controlled object group B. In the embodiment, the specific switch box 8 is adopted to accommodate the first controlled switch 1, the second controlled switch 2, the third controlled switch 3 and the fourth controlled switch 4; and the switch box 8 and other parts are connected through an interface, which is convenient for proper wire routing.

As shown in FIG. 6, in one embodiment, the control panel 9 may comprises an operation panel 91, a third housing 92, a fourth housing 93, a second circuit board 94, a control module 5 and a third interface 96. The operation panel 91 is configured to receive a user operation command; the control panel 91 is mounted on the third housing 92; the fourth housing 93 may engage with the third housing 92; the second circuit board 94 is arranged between the third housing 92 and the fourth housing 93; the control module 5 is connected with the operation panel 91 and assembled in the second circuit board 94; the third interface 96 is connected with the control module 5, and configured to output at least one of the first control signal, the second control signal and the controlled component control signal which are generated by the control module 5 to the switch box 8. The control module 5 may adopt a control chip. In the embodiment, the second circuit board 94 assembled with the control module 5 is accommodated between the third housing 92 and the fourth housing 93, at the same time, the operation panel 91 is mounted on the third housing 92, therefore, the integration of the control panel 9 is substantially improved, which is convenient for operation.

Referring to FIG. 2, in one embodiment, the apparatus may further comprise a detection module 13 at least configured to detect a water level of a water tank of the recreational vehicle; the detection module 13 may further be configured to detect the working status of other controlled objects or controlled components. The switch box 8 is connected with the control panel 9 via a Controller Area Network bus.

Figure 8:
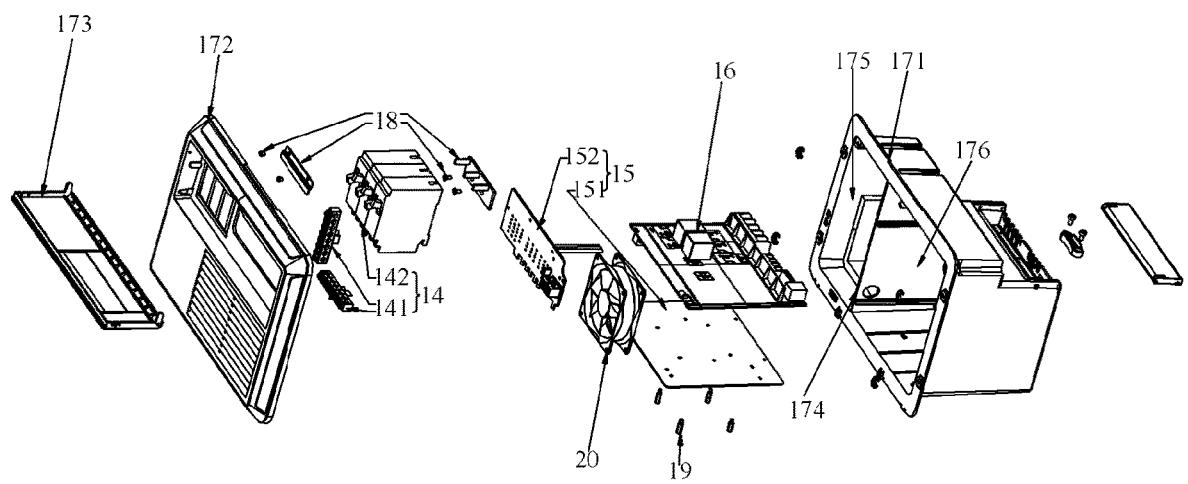
FIG. 8 is an exploded schematic view of a power supply box, and an AC input component, a DC power supply component and a switch circuit board accommodated therein according to yet another embodiment.

Referring to FIG. 8, in one embodiment, the apparatus further includes an AC input component 14, a DC power supply component 15, a switch circuit board 16 and a power supply box. The AC input component 14 is configured to input alternating current. The DC power supply component 15 is connected to the AC input component 14 for AC-DC transforming the alternating current to acquire DC power supply supplying power to the recreational vehicle control apparatus. The first controlled switch, the second controlled switch, the third controlled switch and the fourth controlled switch are integrated on the switch circuit board 16. The power supply box is configured to accommodate the AC input component 14, the DC power supply component 15 and the switch circuit board 16. The AC input component 14 may include an AC connection terminal 141 and a breaker 142. The breaker 42 determines whether to switch on alternating current input by the AC connection terminal 141 and is mounted in the power supply box via a first fixation assembly 18. The DC power supply component 15 includes a power supply transformation board 151 and a fuse board 152. The power supply transformation board 151 is configured to AC-DC transform alternating current output by the breaker 142 to acquire DC power supply. The DC power supply, upon passing through a fuse on the fuse board 152, supplies power to the recreational vehicle control apparatus. For example, the DC power supply may supply power to the first controlled switch, the second controlled switch, the third controlled switch and the fourth controlled switch. The power supply transformation board 151 is mounted beneath the switch circuit board 16 via a second fixation assembly 19.

Figure 9:
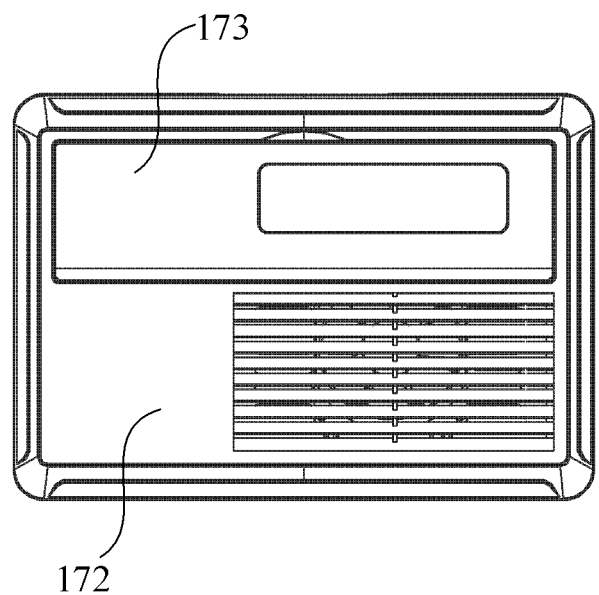
FIG. 9 is a structural schematic view of a cover according to yet another embodiment.
Figure 10:
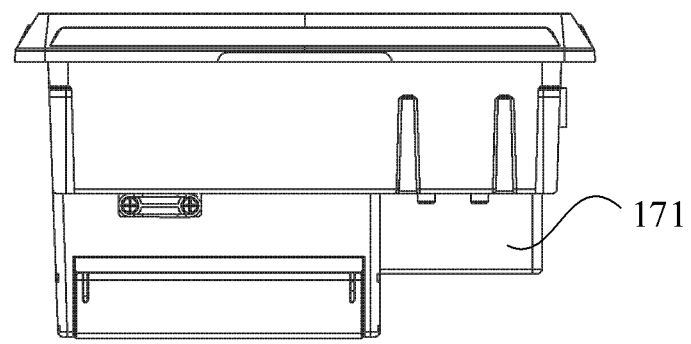
FIG. 10 is a structural schematic view of a power supply housing according to yet another embodiment.

Referring to FIGS. 8, 9 and 10, in one embodiment, the power supply box includes a power supply housing 171, a cover 172 and a separator 174. The cover 172 covers the power supply housing 171. The cover 172 and the power supply housing 171 together define an accommodation space. The separator 174 is configured to separate the accommodation space into a first space 175 and a second space 176. The AC input component 14 is accommodated in the first space 175. Specifically, the AC connection terminal 141 and the breaker 142 are accommodated in the first space. The DC power supply component 15 and the switch circuit board 16 are accommodated in the second space 176. Specifically, the power supply transformation board 151, the fuse board 152 and the switch circuit board 16 are accommodated in the second space 176. A fan 20 is also accommodated in the second space 176. The cover 172 further includes a flip door 173.

A recreational vehicle is provided by the present application. In one embodiment, the recreational vehicle comprises a recreational vehicle body and the recreational vehicle control apparatus described in any one of the above embodiments. The recreational vehicle body may be arranged with the controlled object group and the controlled component group. The controlled object group may include electrical machineries respectively arranged on the recreational vehicle. The electrical machineries are configured to drive a telescopic component on the recreational vehicle, for example, an electrical machinery or motor for driving the telescopic component on the recreational vehicle. The telescopic component may be an expansion tank which may expand out of or withdraw back in the recreational vehicle. The telescopic component may be a telescopic shade canopy, or other telescopic structures arranged on the recreational vehicle. The controlled component group may comprise at least one of a heating components, a lighting component, a temperature regulation component and a water supply component arranged on the recreational vehicle. The heating component may be a heater arranged on the recreational vehicle. The lighting component may be lamps arranged on the recreational vehicle. The temperature regulation component may be an air conditioner arranged on the recreational vehicle. The water supply component may be a water pump arranged on the recreational vehicle.

Disclosures above only describe preferable embodiments of the present application, and should not be deemed as limiting the protection scope of the present application. Equivalents or alternatives made by those skilled in the art based on the technical solutions and principle should also fall within the protection scope of the present application. Furthermore, although some specific terms are used in the specification, the terms are merely for convenience purpose without limiting the present application.

What is claimed is:

1. A recreational vehicle control apparatus, comprising,
a first controlled switch configured to generate a first output signal in response to receiving a first control signal, wherein the first controlled switch switches a polarity of the first output signal based on a status of the first control signal;
a second controlled switch configured to generate a second output signal in response to receiving the first control signal, wherein the second controlled switch switches a polarity of the second output signal based on the status of the first control signal; the second controlled switch outputs the second output signal to a first controlled end of a controlled object group, the controlled object group comprising a plurality of controlled objects; the first controlled end is connected with a first input end of each of the controlled objects; and
a third controlled switch configured to generate a third output signal in response to receiving a second control signal and receiving the first output signal transmitted by the first controlled switch, wherein a polarity of the third output signal is opposite to the polarity of the second output signal; the third controlled switch outputs the third output signal to a second controlled end of the controlled object group; the second controlled end is connected to a second input end of each of the controlled objects.

2. The recreational vehicle control apparatus of claim 1, wherein
in accordance with a determination that the first control signal is in a first status, the polarity of the second output signal is a first polarity, the polarity of the third output signal a second polarity, in accordance with a determination that the first control signal is in a second status, the polarity of the second output signal is the second polarity, the polarity of the third output signal the first polarity.

3. The recreational vehicle control apparatus of claim 1, further comprising:
a control module connected respectively with the first controlled switch, the second controlled switch and the third controlled switch, the control module being configured to output the first control signal and the second control signal.

4. The recreational vehicle control apparatus of claim 2, further comprising:
a control module connected respectively with the first controlled switch, the second controlled switch and the third controlled switch, the control module being configured to output the first control signal and the second control signal.

5. The recreational vehicle control apparatus of claim 1, wherein,
the first controlled switch comprises a first coil, a first dynamic contact, a first static contact and a second static contact; the second controlled switch comprises a second coil, a second dynamic contact, a third static contact and a fourth static contact;
the apparatus further comprises:
a first power supply for supplying power to the first coil and the second coil;
a second power supply for supplying power to the controlled object group via the first controlled switch and the second controlled switch; wherein
a first end of the first coil and a first end of the second coil are both connected to an output positive end of the first power supply, a second end of the first coil and a second end of the second coil both receive the first control signal;
in accordance with a determination that the first coil is powered off, the first dynamic contact contacts with the first static contact; in accordance with a determination that the first coil is powered on, the first dynamic contact contacts with the second static contact; the first static contact is connected with an output positive end of the second power supply, the second static contact connected with an output negative end of the second power supply; the first output signal is output by the first dynamic contact;
in accordance with a determination that the second coil is powered off, the second dynamic contact contacts with the third static contact; in accordance with a determination that the second coil is powered on, the second dynamic contact contacts with the fourth static contact;

the third static contact is connected with the output negative end of the second power supply, the fourth static contact connected with the output positive end of the second power supply; the second output signal is output by the second dynamic contact.

6. The recreational vehicle control apparatus of claim 2, wherein, the first controlled switch comprises a first coil, a first dynamic contact, a first static contact and a second static contact; the second controlled switch comprises a second coil, a second dynamic contact, a third static contact and a fourth static contact;

the apparatus further comprises, a first power supply for supplying power to the first coil and the second coil;

a second power supply for supplying power to the controlled object group via the first controlled switch and the second controlled switch; wherein a first end of the first coil and a first end of the second coil are both connected to an output positive end of the first power supply, a second end of the first coil and a second end of the second coil both receive the first control signal;

in accordance with a determination that the first coil is powered off, the first dynamic contact contacts with the first static contact; in accordance with a determination that the first coil is powered on, the first dynamic contact contacts with the second static contact; the first static contact is connected with an output positive end of the second power supply, the second static contact connected with an output negative end of the second power supply; the first output signal is output by the first dynamic contact;

in accordance with a determination that the second coil is powered off, the second dynamic contact contacts with the third static contact; in accordance with a determination that the second coil is powered on, the second dynamic contact contacts with the fourth static contact; the third static contact is connected with the output negative end of the second power supply, the fourth static contact connected with the output positive end of the second power supply; the second output signal is output by the second dynamic contact.

7. The recreational vehicle control apparatus of claim 5, wherein the third controlled switch comprises a third coil, a third dynamic contact, a fifth static contact and a sixth static contact, a first end of the third coil being connected with the output positive end of the first power supply, a second end of the third coil receiving the second control signal; wherein in accordance with a determination that the third coil is powered off, the third dynamic contact contacts with the fifth static contact; in accordance with a determination that the third coil is powered on, the third dynamic contact contacts with the sixth static contact; the third dynamic contact receives the first output signal; the sixth static contact outputs the third output signal.

8. The recreational vehicle control apparatus of claim 1, further comprising:

a plurality of fourth controlled switches configured to control a controlled component group, each fourth controlled switch being connected with one controlled component of the controlled component group and generating a control output signal output to the controlled component in response to receiving a controlled component control signal.

9. The recreational vehicle control apparatus of claim 8, wherein the first controlled switch, the second controlled switch, the third controlled switch and the fourth controlled switch are normally closed relays;

the controlled object group comprises electrical machineries respectively arranged on the recreational vehicle, the electrical machineries being configured to drive a telescopic component arranged on the recreational vehicle;

the controlled component group comprises at least one of a heating component, a lighting component, a temperature regulation component and a water supply component arranged on the recreational vehicle.

10. The recreational vehicle control apparatus of claim 8, further comprising:

a power supply main interface for inputting the second power supply and connecting with the first controlled switch, the second controlled switch, the third controlled switch and the fourth controlled switch.

11. The recreational vehicle control apparatus of claim 8, further comprising:

a switch box for accommodating the first controlled switch, the second controlled switch, the third controlled switch and the fourth controlled switch; and a control panel connected with the switch box for outputting the first control signal, the second control signal and the controlled component control signal.

12. The recreational vehicle control apparatus of claim 11, wherein the switch box comprises:

a first housing;

a second housing which is capable of engaging with the first housing;

a first circuit board, wherein the first controlled switch, the second controlled switch, the third controlled switch and the fourth controlled switch are assembled in the first circuit board; the first circuit board is arranged between the first housing and the second housing;

a first interface configured to input the first control signal, the second control signal and the controlled component control signal; and a second interface configured to output the second output signal and the third output signal.

13. The recreational vehicle control apparatus of claim 11, wherein the control panel comprises:

an operation panel configured to receive a user operation command;

a third housing, the operation panel being mounted on the third housing;

a fourth housing, the fourth housing being capable of engaging with the third housing;

a second circuit board, the second circuit board being arranged between the third housing and the fourth housing;

a control module, the control module being connected with the operation panel and being assembled in the second circuit board;

a third interface, connected with the control module, the third interface being configured to output at least one of the first control signal, the second control signal and the controlled component control signal which are generated by the control module to the switch box.

14. The recreational vehicle control apparatus of claim 11, further comprising:

a detection module at least configured to detect a water level of a water tank, wherein the switch box is connected with the control panel via a Controller Area Network bus.

15. The recreational vehicle control apparatus of claim 8, further comprising:
- an AC input component configured to input alternating current;
- a DC power supply component connected to the AC input component for AC-DC transforming the alternating current so as to acquire DC power supply supplying power to the recreational vehicle control apparatus;
- a switch circuit board, wherein the first controlled switch, the second controlled switch, the third controlled switch and the fourth controlled switch are integrated on the switch circuit box; and
- a power supply box configured to accommodate the AC input component, the DC power supply component and the switch circuit board.

16. The recreational vehicle control apparatus of claim 15, wherein the power supply box comprises:
- a power supply housing;
- a cover covering the power supply housing, the cover and the power supply housing together defining an accommodation space; and
- a separator configured to separate the accommodation space into a first space and a second space, wherein the AC input component is accommodated in the first space, the DC power supply component and the switch circuit board is accommodated in the second space.

17. A recreational vehicle comprising a recreational vehicle body and the recreational vehicle control apparatus of any one of claim 1.

18. A recreational vehicle comprising a recreational vehicle body and the recreational vehicle control apparatus of any one of claim 2.

19. A recreational vehicle comprising a recreational vehicle body and the recreational vehicle control apparatus of any one of claim 3.

20. A recreational vehicle comprising a recreational vehicle body and the recreational vehicle control apparatus of any one of claim 4.

* * * * *